United States Patent [19]
Casper et al.

[11] Patent Number: 5,627,485
[45] Date of Patent: May 6, 1997

[54] VOLTAGE-INDEPENDENT SUPER VOLTAGE DETECTION CIRCUIT

[75] Inventors: Stephen L. Casper; James E. Miller, both of Boise, Id.

[73] Assignee: Micron Technology, Inc., Boise, Id.

[21] Appl. No.: 494,483

[22] Filed: Jun. 26, 1995

[51] Int. Cl.$^6$ .................................................. H03K 5/153
[52] U.S. Cl. ......................... 327/77; 327/78; 327/80; 327/530
[58] Field of Search ................................. 327/77, 78, 79, 327/80, 81, 74, 143, 142, 198, 530

[56] References Cited

U.S. PATENT DOCUMENTS

| | | | |
|---|---|---|---|
| 4,658,156 | 4/1987 | Hashimoto | 327/77 |
| 5,083,045 | 1/1992 | Yim et al. | 327/80 |
| 5,118,968 | 6/1992 | Douglas et al. | 327/81 |
| 5,170,077 | 12/1992 | Schreck | 327/80 |
| 5,278,458 | 1/1994 | Holland et al. | 327/77 |
| 5,278,460 | 1/1994 | Casper | 307/296.5 |

OTHER PUBLICATIONS

Prior Circuit used by Micron Technology, Inc. no date.

*Primary Examiner*—Toan Tran
*Attorney, Agent, or Firm*—Angus C. Fox, III

[57] ABSTRACT

This invention is a super voltage detection circuit that functions independent of power supply voltage. The circuit employs a reference node that is coupled to $V_{CC}$ through a current-limiting device. The node is also coupled to ground via a plurality of series-coupled N-channel diodes. The current-sinking capability of the series-coupled diode path is greater than the current passing capability of the current-limiting device. Thus, a reference voltage is established at the node. The reference voltage is applied to the gate of a P-channel field-effect transistor which acts as a comparator device. The source region of the comparator device is coupled to an input terminal through a plurality of series coupled N-channel diodes. A super voltage may be selectively applied to the terminal. The source of the comparator device is also coupled to the reference node through an N-channel diode, which assures that the comparator transistor is always at a voltage lower than the gate when no super voltage is applied to the input terminal. The drain region of the comparator device is coupled to ground through a device which functions as a resistor. The voltage step-down between the input terminal and the source is set so that when a super voltage is applied to the terminal, the potential on the source rises above the gate voltage, thus initiating current flow through the comparator device. Therefore, the potential at the drain is indicative of the presence of a super voltage at the input terminal.

23 Claims, 1 Drawing Sheet

VOLTAGE-INDEPENDENT SUPER VOLTAGE DETECTION CIRCUIT

FIELD OF THE INVENTION

This invention relates to integrated circuits and, more particularly, to circuits for detecting a super voltage that is commonly used to select a test mode in an integrated circuit during burn-in operations.

BACKGROUND OF THE INVENTION

Standard integrated circuits typically utilize two standard operating input voltage levels: a high input voltage level ($V_{IH}$) and a low input voltage level ($V_{IL}$). Both levels are set by industry standards, and no special consideration is given whether the circuit is powered with a regulated power supply with very tight tolerances or with an unregulated supply. For a typical dynamic random access memory (DRAM), the industry standard $V_{IL}$ and $V_{IH}$ values are −1.0 V to 0.8 V and 2.4 V to 6.5 V. Although DRAMs are typically powered by unregulated supplies having an output voltage that varies from 4.5 V to 5.5 V, compliance with the industry standard input voltage levels is still required.

Notwithstanding the standard power supply voltage range of 4.5–5.5 V, DRAMs of identical design are routinely expected to not only operate with a standard power supply voltage, but to operate with a 3.0 V power supply as well. In addition, during qualification and testing, DRAMs are routinely subjected to much higher voltages than the 5.5 V standard maximum power supply specification. For example, during burn-in testing, the parts are subjected to a maximum power supply specification voltage of 7.5 V and elevated temperatures in order to accelerate the failure of functioning, but terminally-ill parts.

In order to select one of several test modes available on an integrated circuit such as a DRAM, a "super voltage" (i.e., one that is higher than any that the part will experience during any normal mode of operation) is applied at a designated input terminal. Heretofore, super voltage select circuits have been voltage dependent. In other words, the super voltage level that would trip the test mode was proportional to the power supply voltage applied to the part. Thus, the super voltage level for a part operating with a 3.0 V power supply voltage would be considerably lower than for the same part operating with a 7.5 V power supply voltage during burn-in. In the past, this has not presented a serious problem. However, as feature dimensions and film thicknesses in future generations of integrated circuits are reduced in the interest of increased circuit density and decreased power consumption, the super voltage level required to enter a test mode on a part operating with a 7.5 V power supply during burn-in testing may sufficiently high to cause breakdown of dielectric layers and unwanted source-to-drain "punchthrough" in circuitry that is exposed to the super voltage.

What is needed is a new super voltage detection circuit that is voltage independent. In such a circuit, the super voltage trip level will be constant and independent of the power supply voltage. Such a circuit will protect the device against damage which might be occasioned by entering a test mode when operating at high power supply voltage levels.

SUMMARY OF THE INVENTION

This invention is a super voltage detection circuit that functions independent of power supply voltage. The circuit employs a reference node that is coupled to $V_{CC}$ through at least one P-channel device which functions as a resistor. The node is also coupled to ground via a plurality of series-coupled N-channel diodes. The current-sinking capability of the series-coupled diode path is greater than the current passing capability of the P-channel device. Thus, a reference voltage is established at the node, the difference in potential between the reference voltage and ground potential being approximately equal to the number of diodes multiplied by the characteristic threshold voltage of such diodes (in reality, it will be somewhat more due to the resistivity of the diodes themselves). The reference voltage is applied to the gate of a P-channel field-effect transistor which acts as a comparator device. The source region of the comparator device is coupled to an input terminal through a plurality of series coupled N-channel diodes. A super voltage may be selectively applied to the terminal. The source of the comparator device is also coupled to the reference node through an N-channel diode, which assures that the comparator transistor is always at a voltage lower than the gate when no super voltage is applied to the input terminal. The drain region of the comparator device is coupled to ground through a resistor or at least one device which functions as a resistor. The voltage step-down between the input terminal and the source is set so that when a super voltage is applied to the terminal, the potential on the source rises above the gate voltage, thus initiating current flow through the comparator device. Therefore, the potential at the drain is indicative of the presence of a super voltage at the input terminal. An inverter coupled to the drain region drives an output signal.

PREFERRED EMBODIMENT OF THE INVENTION

Figure 1:
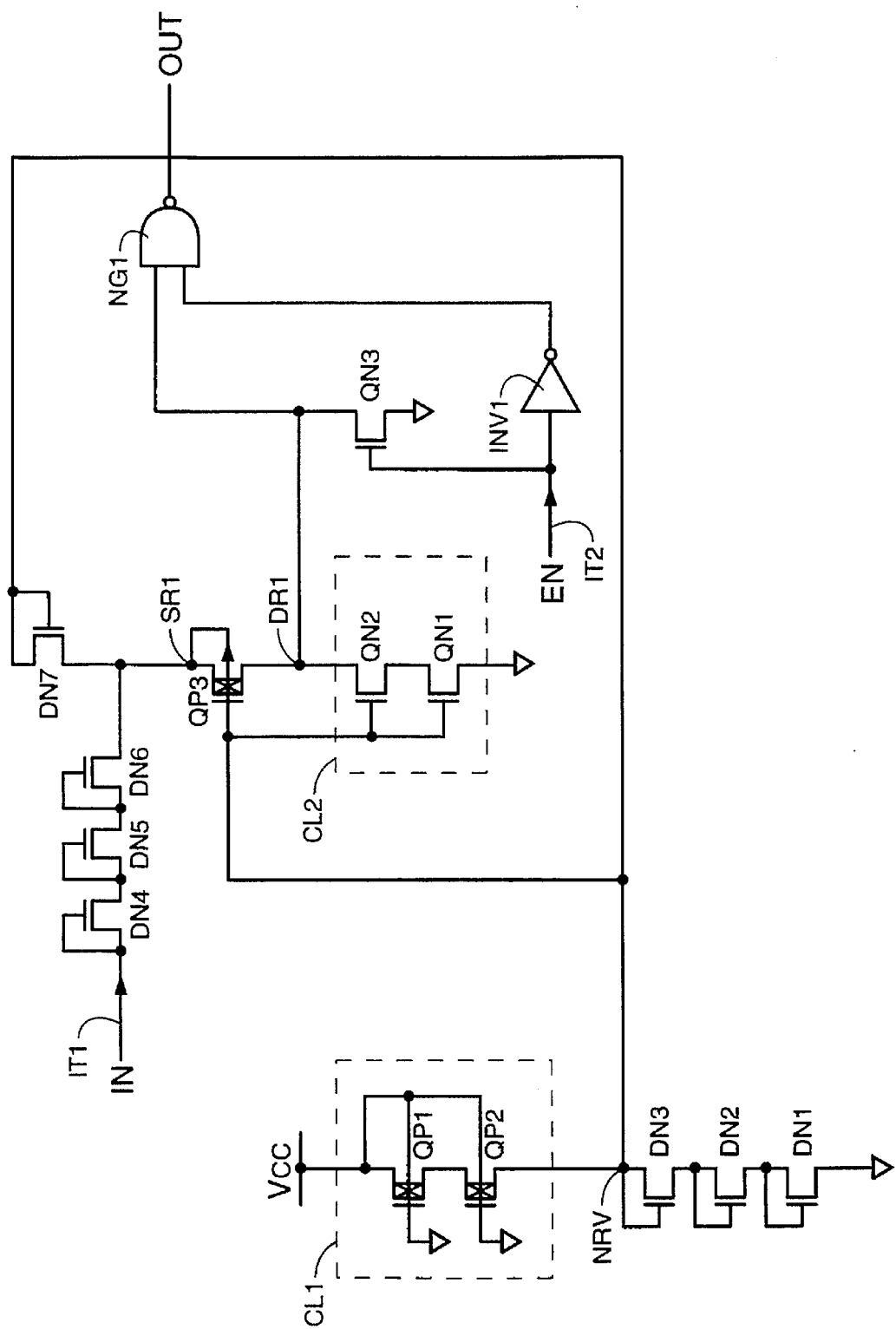
FIG. 1 is an electrical schematic of the voltage independent super voltage detection circuit.

Referring now to FIG. 1, the new voltage-independent super voltage detection circuit comprises a reference voltage node $N_{RV}$ that is coupled to an external power supply voltage $V_{CC}$ through a first current-limiting device CL1, and to ground through a first series of series-coupled N-channel diodes DN1–DN3. In this particular embodiment of the circuit, the current-limiting device comprises a pair of series-coupled P-channel insulated-gate field-effect transistors QP1 and QP2. Both transistors QP1 and QP2 have grounded gates and are, thus, hard wired "full-on". The current-sinking capability of the current path through the series-coupled diodes DN1–DN3 is greater than the current passing capability of the current-limiting device (i.e., the series-coupled P-channel transistors QP1 and QP2). Thus, a reference voltage $V_{REF}$ is established at the node $N_{RV}$, with the difference in potential between the reference voltage and ground potential being approximately equal to the number of diodes multiplied by the characteristic threshold voltage of such diodes. In reality, the reference voltage will be somewhat greater than the number of diodes multiplied by the characteristic threshold voltage due to the resistivity of the diodes themselves.

The reference voltage set by the diodes DN1–DN3 at node $N_{RV}$ is applied to the gate of a P-channel field-effect transistor QP3, which acts as a comparator device. The source region SR1 of the comparator transistor QP3 is coupled to an input terminal IT1 through a second series of series-coupled N-channel diodes DN4–DN6. A super voltage may be selectively applied to the terminal IT1 for the selection of a test mode. The source SR1 of the comparator transistor QP3 is also coupled to the reference node $N_{RV}$ through an N-channel diode DN7, which assures that the source region SR1 of comparator transistor QP3 is always at a voltage lower than the gate of transistor QP3, so that the transistor QP3 is always in an "OFF" state when no super voltage is applied to the input terminal. The drain region DR1 of comparator transistor QP3 is coupled to ground through a second current-limiting device CL2. In this particular embodiment of the invention CL2 comprises a pair of series-coupled long-channel N-channel insulated-gate field-effect transistors QN1 and QN2, both of which have their gates tied to the reference voltage node $N_{RV}$. The step-down between the input terminal IT1 and the source SR1 of comparator transistor QP3 is set so that when a super voltage of a known level is applied to the terminal, the potential on the source rises above the gate voltage, thus initiating current flow through the comparator device. Therefore, the potential at the drain DR1 of comparator transistor QP3 is indicative of the presence of a super voltage at the input terminal IT1. Because 7.0 volts is the highest power supply voltage that is normally used used (e.g., during burn-in), a super voltage potential need be only marginally higher than 7.0 volts (e.g., 7.5–8.0 V).

Still referring to FIG. 1, it will be noted that for this particular embodiment of the invention, a separate enable path is provided at enable input terminal IT2. The signal input to terminal IT2 is inverted and amplified by inverter INV1, after which it is sent to one of a pair of inputs of NAND gate NG1. The other input of NAND gate NG1 is coupled to the drain of comparator transistor QP3. The drain of transistor QP3 is grounded through N-channel field-effect transistor QN3 whenever the enable signal is high. Thus, the enable signal input to terminal IT2 is active when low. Likewise, the output signal OUT from NAND gate NG1 is active when low. In other words, for the output of NG1 to be low, both inputs must be high.

Although only a single embodiment of the invention has been disclosed herein, it will be obvious to those having ordinary skill in the art of integrated circuit design that changes and modifications may be made thereto without departing from the scope and spirit of the invention as hereinafter claimed.

We claim:

1. A super voltage detection circuit comprising:
   (a) an input terminal to which a super voltage may be selectively applied;
   (b) a first and second pluralities of series-coupled diodes;
   (c) first and second current-limiting devices;
   (d) a reference voltage node coupled to both a first potential through said first plurality of series-coupled diodes, and to a second potential through said first current-limiting device; and
   (e) an insulated-gate field-effect transistor having its gate coupled to the reference voltage node, a first source/drain region coupled to said input terminal through said second plurality of series-coupled diodes, and a second source/drain region coupled to said first potential through a second current-limiting device, the potential on said second source/drain region being indicative of the presence of a super voltage on said input terminal.

2. The super voltage detection circuit of claim 1, which further comprises a logic gate having a first input coupled to said drain region and a second input coupled to an enable signal.

3. The detection circuit of claim 1, wherein said first current limiting device comprises a P-channel field-effect transistor.

4. The detection circuit of claim 1, wherein said first current limiting device comprises multiple series-coupled P-channel field-effect transistors having their gates coupled to ground potential.

5. The detection circuit of claim 1, wherein said second current-limiting device comprises an N-channel field-effect transistor having its gate coupled to the reference voltage node.

6. The detection circuit of claim 1, wherein said second current limiting device comprises multiple series-coupled N-channel field-effect transistors having their gates coupled to the reference voltage node.

7. The detection circuit of claim 1, wherein said first source/drain region is also coupled to the reference voltage node through a diode.

8. A super voltage detection circuit comprising:
   (a) an input terminal to which a super voltage may be selectively applied;
   (b) first and second pluralities of series-coupled N-channel diodes;
   (c) first and second current-limiting devices;
   (d) a reference voltage node coupled to both ground potential through said first plurality of series-coupled diodes, and to a power supply voltage through said first current-limiting device; and
   (e) an insulated-gate P-channel field-effect transistor having its gate coupled to the reference voltage node, its source region coupled to said input terminal through said second plurality of series-coupled diodes, and its drain region coupled to ground potential through said second current-limiting device, the potential on said drain region being indicative of the presence of a super voltage on said input terminal.

9. The super voltage detection circuit of claim 8, which further comprises a logic gate having a first input coupled to said drain region and a second input coupled to an enable signal.

10. The detection circuit of claim 8, wherein said first current-limiting device comprises a P-channel field-effect transistor having its gate coupled to ground potential.

11. The detection circuit of claim 8, wherein said first current limiting device comprises multiple series-coupled P-channel field-effect transistors having their gates coupled to ground potential.

12. The detection circuit of claim 8, wherein said second current-limiting device comprises an N-channel field-effect transistor having its gate coupled to the reference voltage node.

13. The detection circuit of claim 8, wherein said second current limiting device comprises multiple series-coupled N-channel field-effect transistors having their gates coupled to the reference voltage node.

14. The detection circuit of claim 8, wherein said source region is also coupled to the reference voltage node through an N-channel diode.

15. A super voltage detection circuit comprising:
   (a) an input terminal to which a super voltage may be selectively applied;
   (b) first and second diode sets, each set having at least one diode;
   (c) first and second current limiting devices;
   (d) a reference voltage node to which a reference voltage is supplied, said reference voltage node being coupled to both a first voltage supply bus via said first diode set and to a second voltage supply bus via said first current limiting device;

(e) a field-effect transistor having its gate coupled to the reference voltage node, a first source/drain region coupled to said input terminal via said second diode set, and a second source/drain region coupled to said first voltage supply bus via said second current limiting device, the potential on said second source/drain region being indicative of the presence of a super voltage on said input terminal.

16. The super voltage detection circuit of claim 15, wherein said first diode set comprises multiple, series-coupled diodes.

17. The super voltage detection circuit of claim 15, wherein said second diode set comprises multiple, series-coupled diodes.

18. The super voltage detection circuit of claim 15, wherein said field-effect transistor is a P-channel device, said first voltage supply bus is at ground potential and said second voltage supply bus is at a potential of $V_{CC}$.

19. A super voltage detection circuit comprising:
(a) an input terminal to which a super voltage may be selectively applied;
(b) a first current limiting device;
(c) a reference voltage node to which a reference voltage is supplied, said reference voltage node being coupled to a first voltage supply bus via a first diode set, said first diode set having at least one diode, and to a second voltage supply bus through a second current limiting device;
(d) a field-effect transistor having a gate coupled to the reference voltage node, a first source/drain region coupled to said input terminal, and a second source/drain region coupled to said first voltage supply bus via the current limiting device, the potential on said second source/drain region being indicative of the presence of a super voltage on said input terminal.

20. The super voltage detection circuit of claim 19, wherein said first source/drain region is coupled to the input node through a second diode set, said second diode set having at least one diode.

21. The super voltage detection circuit of claim 20, wherein said second diode set comprises multiple, series-coupled diodes.

22. The super voltage detection circuit of claim 19, wherein said first diode set comprises multiple, series-coupled diodes which set the reference voltage.

23. The super voltage detection circuit of claim 20, wherein said field-effect transistor is a P-channel device, said first voltage supply bus is at ground potential and said second voltage supply bus is at a potential of $V_{CC}$.

* * * * *